(12) United States Patent
Mei et al.

(10) Patent No.: US 7,541,227 B2
(45) Date of Patent: Jun. 2, 2009

(54) THIN FILM DEVICES AND METHODS FOR FORMING THE SAME

(75) Inventors: Ping Mei, Palo Alto, CA (US); Craig M. Perlov, Palo Alto, CA (US); Albert Hua Jeans, Palo Alto, CA (US); Carl Philip Taussig, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 171 days.

(21) Appl. No.: 11/589,580

(22) Filed: Oct. 30, 2006

(65) Prior Publication Data

US 2007/0040491 A1    Feb. 22, 2007

Related U.S. Application Data

(63) Continuation-in-part of application No. 11/144,204, filed on Jun. 2, 2005, now Pat. No. 7,341,893, and a continuation-in-part of application No. 11/264,321, filed on Nov. 1, 2005.

(51) Int. Cl.
*H01L 21/84* (2006.01)
(52) U.S. Cl. .................. 438/149; 438/62; 257/E21.561
(58) Field of Classification Search ......... 438/151–166, 438/60, 149; 257/E21.561
See application file for complete search history.

(56) References Cited

U.S. PATENT DOCUMENTS

| | | | |
|---|---|---|---|
| 4,492,181 A * | 1/1985 | Ovshinsky et al. .......... 118/718 |
| 6,534,414 B1 | 3/2003 | Wang et al. | |
| 6,593,624 B2 * | 7/2003 | Walker ....................... 257/344 |
| 6,709,929 B2 | 3/2004 | Zhang et al. | |
| 6,740,910 B2 | 5/2004 | Roesner et al. | |
| 6,897,009 B2 | 5/2005 | Johnson, Jr. et al. | |
| 6,924,538 B2 | 8/2005 | Jaiprakash et al. | |
| 6,946,336 B2 | 9/2005 | Pang et al. | |
| 7,037,744 B2 | 5/2006 | Colburn et al. | |
| 7,067,378 B2 | 6/2006 | Fishburn et al. | |
| 7,098,114 B1 | 8/2006 | Syau et al. | |
| 2002/0086483 A1 | 7/2002 | Kim et al. | |
| 2004/0166642 A1 | 8/2004 | Chen et al. | |
| 2005/0121706 A1 | 6/2005 | Chen et al. | |
| 2005/0136419 A1 * | 6/2005 | Lee ................................ 435/6 |
| 2005/0272212 A1 | 12/2005 | Ho et al. | |
| 2005/0285275 A1 | 12/2005 | Son et al. | |
| 2006/0134922 A1 | 6/2006 | Taussig et al. | |
| 2006/0166518 A1 | 7/2006 | Dunnrowicz | |

* cited by examiner

*Primary Examiner*—Richard A. Booth

(57) ABSTRACT

Thin film devices and methods for forming the same are disclosed herein. A method for forming a thin film device includes forming a first at least semi-conductive strip located at a first height relative to a surface of a substrate, and forming a second at least semi-conductive strip adjacent to the first at least semi-conductive strip. The second strip is located at a second height relative to the substrate surface, and the second height is different than the first height. A nano-gap is formed between the first and second at least semi-conductive strips.

14 Claims, 6 Drawing Sheets

THIN FILM DEVICES AND METHODS FOR FORMING THE SAME

CROSS REFERENCE TO RELATED APPLICATIONS

This application is a continuation-in-part of each of: U.S. patent application Ser. No. 11/144,204, filed Jun. 2, 2005 now U.S. Pat. No. 7,341,893; and U.S. patent application Ser. No. 11/264,321, filed Nov. 1, 2005.

BACKGROUND

The present disclosure generally relates to thin film devices and method(s) for forming the same.

Thin film devices (TFDs) are often used in, for example, liquid crystal devices (LCDs), light emitting diodes (LEDs) and plasma display panels (PDPs). A thin film device typically includes a first multi-layered stack including planar at least semi-conductive material segments separated by a gap and a second multi-layered stack disposed on the first multi-layered stack. A three-dimensional profile may be created on the second multi-layered stack to form components of the device, such as a drain electrode, a source electrode, a gate, and/or a channel.

The performance of a thin film device, such as a thin film transistor, depends, at least in part, on the ratio of the width of the planar strips to the dimension of the nano-gap formed between two adjacent strips. If anisotropic conductance is maintained, the device should exhibit improved performance with a larger strip width/nano-gap dimension ratio. In applications where an array of high density of strips is desired (such as, for example, a thin film transistor backplane) the dimension of the nano-gaps should be scaled down to achieve a desired performance level of the device. Current nano-imprinting processes, however, may pose challenges in forming suitably "small" nano-gaps to achieve the desired performance level of a thin film device.

DESCRIPTION OF THE DRAWINGS

Features and advantages of embodiments of the present disclosure will become apparent by reference to the following detailed description and drawings, in which like reference numerals correspond to similar, though not necessarily identical components. For the sake of brevity, reference numerals or features having a previously described function may not necessarily be described in connection with other drawings in which they appear.

DETAILED DESCRIPTION

Embodiment(s) of methods disclosed herein for forming thin film devices advantageously produce uneven (i.e., located at different heights relative to a substrate surface), substantially parallel, at least semi-conductive strips. The methods also produce nano-gaps having a small enough dimension suitable for an array of thin film devices for use in various applications, one example of which includes thin film transistor backplanes. The methods for forming the thin film devices disclosed herein may be accomplished in a roll-to-roll fabrication environment, without the use of nano-imprinting for formation of the gaps. This fabrication process (i.e., roll-to-roll) produces suitably "small" and reliable nano-gaps within the devices with reduced amounts of waste and a desirably high product yield.

Figure 1:
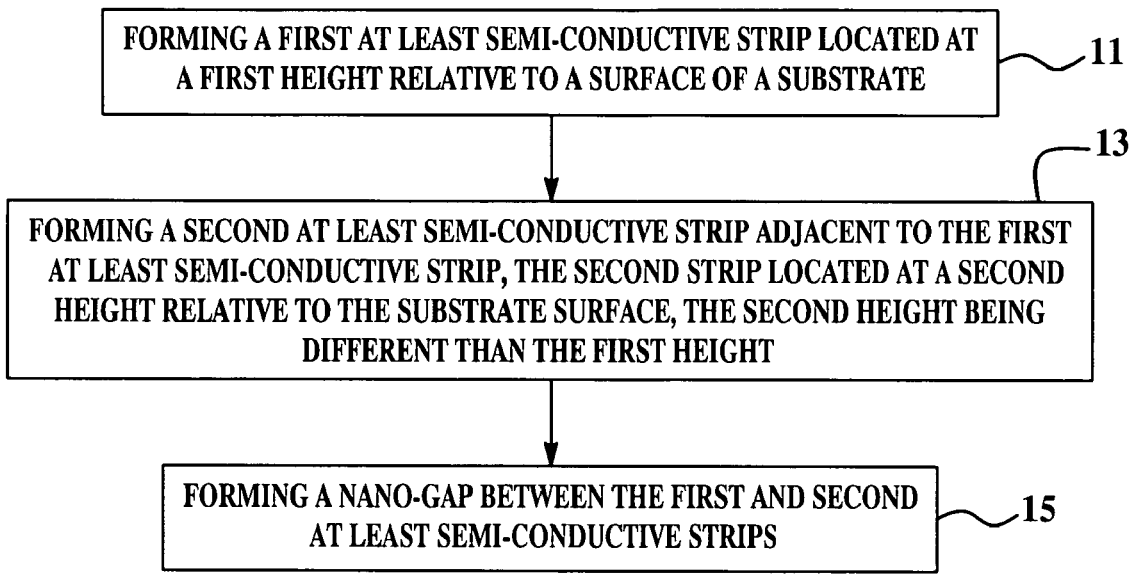
FIG. 1 depicts a flow diagram of an embodiment of the method for forming a thin film device.

Referring now to FIG. 1, an embodiment of the method for forming a thin film device is depicted. Generally, the method includes forming a first at least semi-conductive strip located at a first height relative to a surface of a substrate, as depicted at reference numeral 11. The method further includes forming a second at least semi-conductive strip adjacent to the first at least semi-conductive strip, where the second strip is located at a second height relative to the substrate surface, and where the second height is different than the first height, as depicted at reference numeral 13. A nano-gap is formed between the first and second at least semi-conductive strips, as depicted at reference numeral 15. A non-limiting example of the thin film device formed via this method is a bottom gate electrode for a thin film transistor. Such a device may be incorporated into another thin film device, such as, for example, a thin film transistor backplane.

As used herein, the phrase "located at a height" refers to a distance from one surface of the substrate (e.g., a top or bottom surface) to a surface of the formed strip. As such, the respective strips may be established on the same surface, but may be located at different heights with respect to each other.

In an embodiment, the thin film device includes nano-gaps formed between substantially parallel at least semi-conductive strips. However, it is to be understood that the methods described herein are not intended to be limited to forming substantially parallel strips, and may form any suitable alternate configurations.

Referring now to FIGS. 2A through 2D, an embodiment of the method of forming a thin film device 10 (shown in FIG. 2D) is schematically depicted. It is to be understood that the scale of the components and features illustrated in the drawings may be exaggerated for descriptive and explanatory purposes.

Figure 2A:
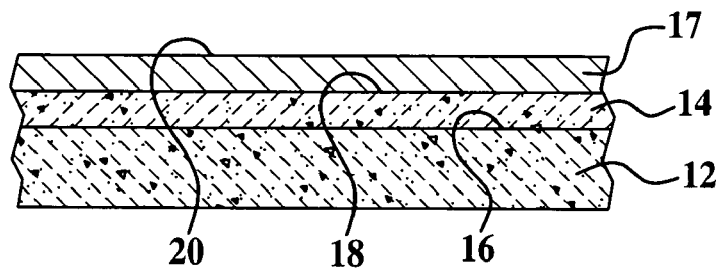
FIGS. 2A through 2D depict cross-sectional cutaway views of a sequence of steps according to an embodiment of a method of forming a thin film device.

With reference to FIG. 2A, the thin film device 10 is made by first providing a substrate 12. Flexible or rigid substrate materials may be suitable for the embodiments disclosed herein. Non-limiting examples of flexible substrate materials include polyimides (with or without an organic coating), polyethylene terephthalate (PET), polyethylene naphthalate (PEN), or the like, or combinations thereof. A non-limiting example of a rigid substrate material is glass. The substrate materials may be in the form of sheets, transparent sheets, webs, or the like, or combinations thereof.

An insulating layer 14 is established on a first surface 16 of the substrate 12. The insulating layer 14 may be an inorganic film, such as a silicon dioxide film or silicon nitride film, or an organic film, such as a polymer film, having a thickness ranging from about 50 nm to about 150 nm. In an embodiment, the thickness of the insulating layer 14 is about 100 nm.

The insulating layer 14 is established on the substrate 12 using a vapor deposition process. In an embodiment, the deposition process is selected from chemical vapor deposition (CVD), plasma enhanced chemical vapor deposition (PECVD), sputter deposition, liquid source mist chemical deposition, flow coating, air spray coating, and combinations thereof.

A thin mask layer 17 is disposed on a first surface 18 of the insulating layer 14 by any suitable means, one example of which is sputtering, e-beam evaporation, or other like deposition processes. The mask layer 17 is generally formed of a material that has an etch selectivity sufficient to act as a masking layer for subsequent processing (e.g., etching) of the insulating layer 14. It should be appreciated that the mask layer 17 may be composed of any suitable material, including metals, other conductive or semi-conductive materials, insulating materials, or combinations thereof, that has a suitable etch selectivity for functioning as a mask. As a non-limiting example, the mask layer 17 is formed of a material that is resistant to an etch process used for etching the insulating layer 14.

Examples of suitable conductive and/or semi-conductive materials to form the mask layer 17 include chromium, aluminum, copper, alloys thereof, and combinations thereof. Examples of suitable insulating materials to form the mask layer 17 include silicon dioxide, silicon nitride, oxynitride, polyimide, and combinations thereof. In an embodiment, the mask layer 17 has a thickness ranging from about 25 nm to about 200 nm. As a non-limiting example, the thickness of the first material 17 is about 50 nm.

After the mask layer 17 is established on the first surface 18 of the insulating layer 14, a removable polymer masking layer or UV curable polymer layer (not shown) may be established on a first surface 20 of the mask layer 17. Photolithography may be performed to pattern the removable polymer masking layer (a non-limiting example of which is a photoresist). Alternatively, an imprint process may be applied to the UV curable polymer layer to form a mask. In a non-limiting example, the mask pattern includes multiple parallel strips. The patterned polymer layer acts as a mask for etching the mask layer 17. It is to be understood that the process used for etching the mask layer 17 is one that is suitable with the etch selectivity of the mask layer 17.

Figure 2B:
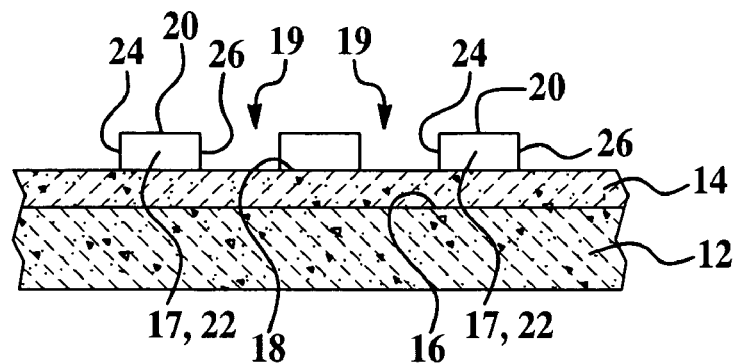

Etching includes removing at least a portion of the mask layer 17 to form one or more trenches 19 (according to the pattern) formed between strips 22 of the mask layer 17. After etching of the mask layer 17 is accomplished, the polymer layer may be removed. The strips 22 of the mask layer 17 (having trenches 19 formed therebetween) are shown in FIG. 2B. Each trench 19 has side surfaces 24, 26 formed by adjacent strips 22. The bottom of each trench 19 is defined by the first surface 18 of the insulating layer 14. The width of the trenches 19, as shown in FIG. 2B, may be about the same width as the patterned and etched strips 22 of the mask layer 17. In an embodiment, the width of the strips 22 ranges from about 0.5 µm to about 10.0 µm. In another embodiment, the width of the strips 22 ranges from about 1.0 µm to about 10.0 µm.

Figure 2C:
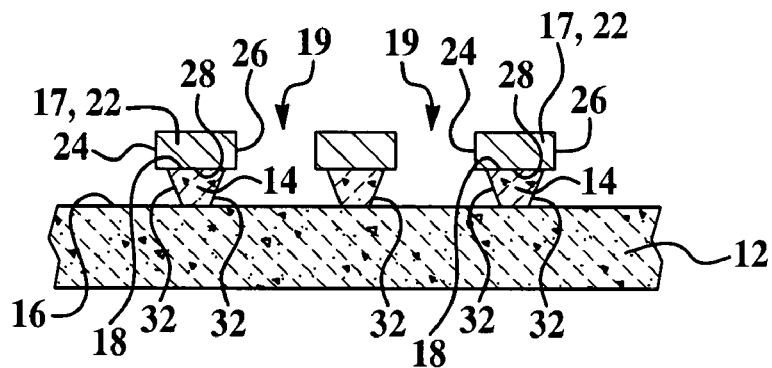

With reference now to FIG. 2C, portions of the insulating layer 14 adjacent the trenches 19 are removed to expose at least portions of the substrate 12. As depicted, removal of these portions of the insulating layer 14 essentially expands the trench 19 to the substrate surface 16. As shown in FIG. 2C, portions of the insulating layer 14 located adjacent a second surface 28 of the mask layer 17 and located adjacent the first surface 16 of the substrate 12 is removed in a generally tapered configuration. The tapering direction may begin at a location underlying the strip 22 and adjacent the side surfaces 24, 26 such that the edge 32 under-cuts the strip 22. The distance from the side surface 24, 26 to the beginning of the edge 32 ranges from about 100 nm to about 200 nm. The edge 32 then tapers generally outwardly (away from a center of the trench 19) as it approaches the first surface 16 of the substrate 12. Thus, the width of the enlarged portion of the trench 19 progressively increases from the start of the edge 32 (under-cutting the strip 22) to the end of the edge 32 located adjacent the first surface 16 of the substrate 12.

Figure 3:
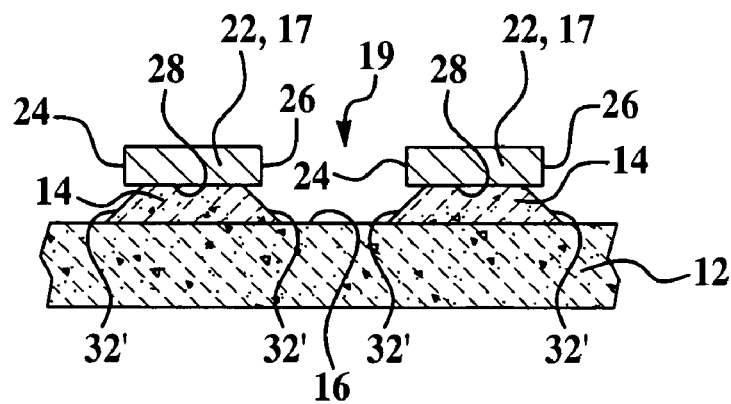
FIG. 3 depicts another embodiment of the method step shown in FIG. 2C.

FIG. 3 depicts another embodiment in which portions of the insulating layer 14 adjacent the trenches 19 are removed. In this embodiment, the trenches 19 are enlarged by removing portions of the insulating layer 14 adjacent the second surface 28 of the mask layer 17 and adjacent the first surface 16 of the substrate 12 to form an edge 32' having a generally tapered configuration. In this embodiment, the tapering direction, again, may generally begin at an area underlying the strip 22 and adjacent respective side surface 24, 26 such that the edge 32' of the enlarged portion of the trench 19 under-cuts the strip 22. The edge 32' in this embodiment tapers generally inwardly (toward a center of the trench 19) while approaching the first surface 16 of the substrate 12. Thus, the width of the enlarged portion of the trench 19 progressively decreases from the start of the edge 32' under-cutting the strip 22 to the end of the edge 32' located adjacent the first surface 16 of the substrate 12.

Figure 4:
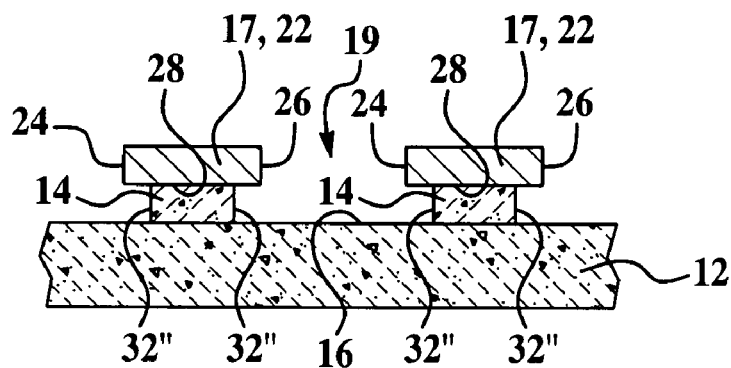
FIG. 4 depicts yet another embodiment of the method step shown in FIG. 2C.

FIG. 4 depicts still another embodiment in which portions of the insulating layer 14 adjacent the trenches 19 are removed. In this embodiment, the trenches 19 are enlarged by removing portions of the insulating layer 14 underlying the trench 19, and some of the layer 14 between the strips 22 and the first surface 16 of the substrate 12. The insulating layer 14 that remains has an edge 32" configuration that is substantially perpendicular to the surfaces 28, 16. In this embodiment, the edge 32" is located a predetermined distance from the trench sides 24, 26 so that it under-cuts the strip 22.

Figure 5:
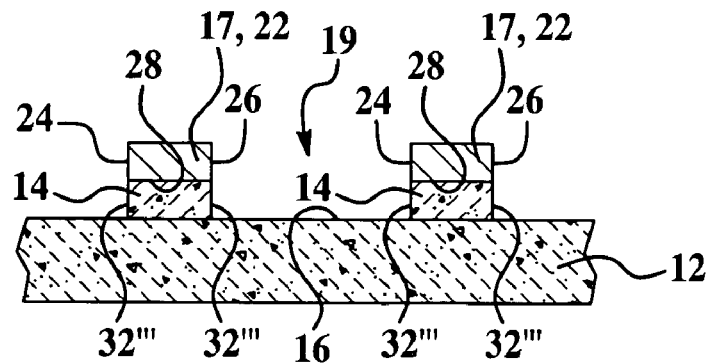
FIG. 5 depicts still another embodiment of the method step shown in FIG. 2C.

FIG. 5 depicts a further embodiment in which portions of the insulating layer 14 adjacent the trenches 19 are removed. In this embodiment, the trenches 19 are enlarged by forming edges 32''' that effectively extend the sides 24, 26. The portion of the insulating layer 14 that is removed is that which directly underlies the trench 19. Similar to the embodiment shown in FIG. 4, the edge 32''' configuration is substantially perpendicular to the surfaces 28, 16. In this embodiment, it is to be understood that the process used to establish the subsequently deposited at least semi-conductive layer 33 (discussed further hereinbelow) is selected so that the layer 33 does not short the device 10 (shown in FIG. 2D). This may be accomplished, for example, via angle deposition processes or other selective deposition processes. The edges 32, 32', 32", 32''', as shown in FIGS. 2C, 3, 4 and 5, are generally formed, for example, by dry or wet chemical etching processes, with a slight over etch. A non-limiting example is an isotropic etching process.

Figure 2D:
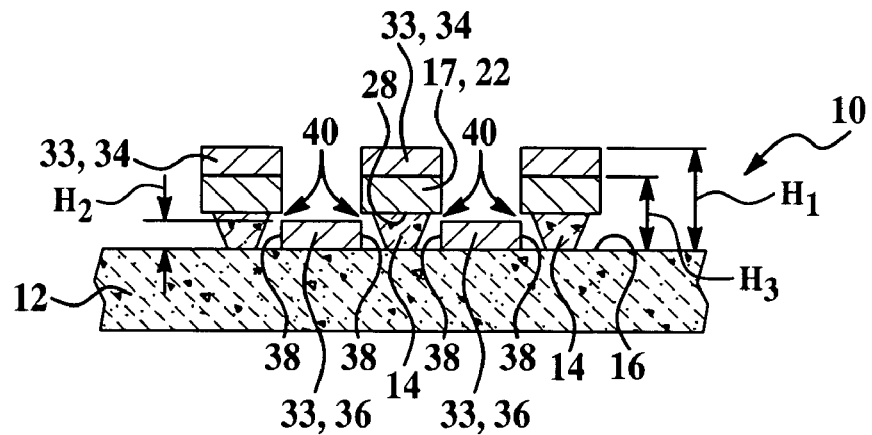

Referring now to FIG. 2D, a material 33, which material is an at least semi-conductive material, is established on at least a portion of the mask layer 17 to form the first at least semi-conductive strip 34, and on at least a portion of the exposed substrate 12 to form the second at least semi-conductive strip 36. As depicted in FIG. 2D, the first semi-conductive strip 34 is located at a first height $H_1$ from the substrate surface 16, and the second semi-conductive strip 36 is located at a second height $H_2$ from the substrate surface 16. In this embodiment, the heights $H_1$, $H_2$ are measured from the substrate surface 16 to a surface of each of the respective strips 34, 36.

It is to be understood that if the strips 22 of the mask layer 17 are semi-conductive or conductive materials, then such strips 22 function as third, at least semi-conductive strips. In this embodiment, the strips 22 are located at a third height $H_3$ from the substrate surface 16, which height $H_3$ is different from the heights $H_1$, $H_2$ of each of the other strips 33, 36.

It is to be understood that the term, "at least semi-conductive" as used herein is intended to mean a material, strip, layer, and/or the like that is semi-conductive, conductive, or combinations thereof. Non-limiting examples of the second semi-conductive material 33 include metals or other conductive materials, semi-conductive materials, or combinations thereof, examples of which are mentioned above.

The material 33 is established (e.g., via methods disclosed hereinabove in reference to mask layer 17) so that discontinuous portions are established on the first surface 20 of the mask layer 17 and on the exposed first surface 16 of the substrate 12 inside the enlarged portion of the trench(es) 19, thereby forming the substantially parallel and staggered (uneven) strips 34, 36, respectively. For any of the embodiments described herein, the width of the strips 36 established on the substrate 12 is generally dependent on the distance between the side surfaces 24, 26 of the strips 22 or the distance between the edges 32, 32', 32", 32''' formed in embodiments shown in FIGS. 2C, 4 and 5. In some embodiments, edges 38 of the strips 36 are generally oriented in line with the side surfaces 24, 26. In embodiments where the edge 32' of the enlarged portion of the trench 19 tapers generally inwardly (as shown in FIG. 3), the width of the strips 36 will generally be smaller than the width of the trench 19 defined by the side surfaces 24, 26. This is due, at least in part, to the narrower end portions of the inwardly-tapered edges 32'. The conductive strips 34 located adjacent the first surface 20 of the first material 17 generally have the same or smaller width as the strips 22.

In an embodiment, the thickness of the strips 34, 36 ranges from about 50 nm to about 100 nm, where the thickness is substantially smaller than the thickness of the insulating layer 14. In this embodiment, the strips 36 established on the substrate 12 have a thickness sufficient to prevent strips 36 from touching the strips 22. This absence of material between the strips 22 and the strips 36 forms a gap 40. In an embodiment, the gap 40 is determined by the shortest distance between the strips 22 of the mask layer 17 (if the strips 22 are at least semi-conductive) and the strips 36, or between the strips 34 and the strips 36. In an embodiment, the gap 40 ranges from about 100 nm to about 1 μm, and is referred to herein as a nano-gap.

It is to be understood that the size of the nano-gap 40 may be altered as desired for a particular end use. For example, a sub-micron gap size may be formed that is suitable for use in an array of strips 22, 34, 36 for a thin film transistor backplane. The size of the gap 40 may vary as long as it is large enough to ensure electrical isolation of semi-conductive or conductive strips 22, 34, 36. The gap 40 size may also be dependent upon the type of transistor formed. As a non-limiting example, amorphous silicon thin film transistors include a nano-gap 40 generally in the range from about 100 nm to about 1 μm.

Figure 6A:
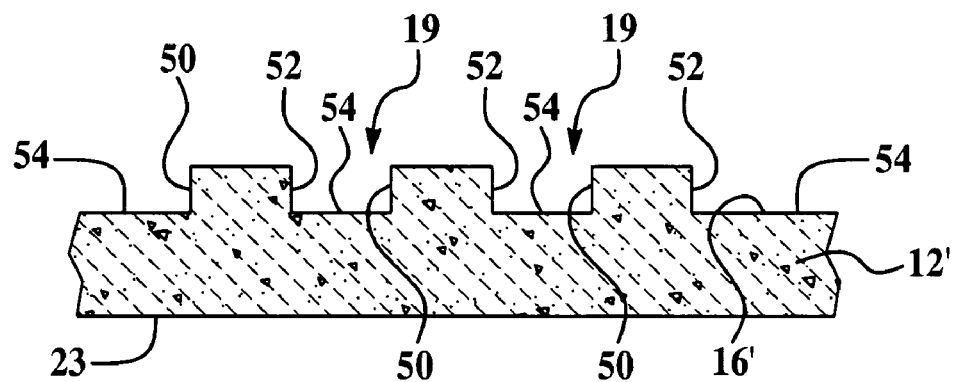
FIGS. 6A through 6C depict cross-sectional cutaway views of a sequence of steps according to another embodiment of a method of forming a thin film device.
Figure 6B:
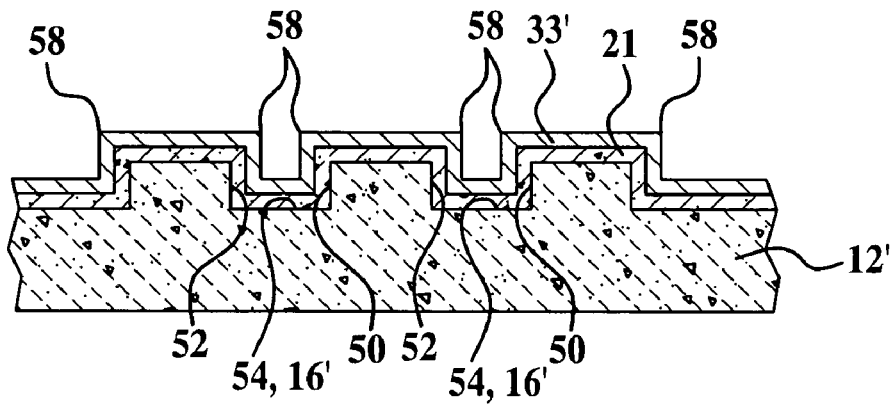
Figure 6C:
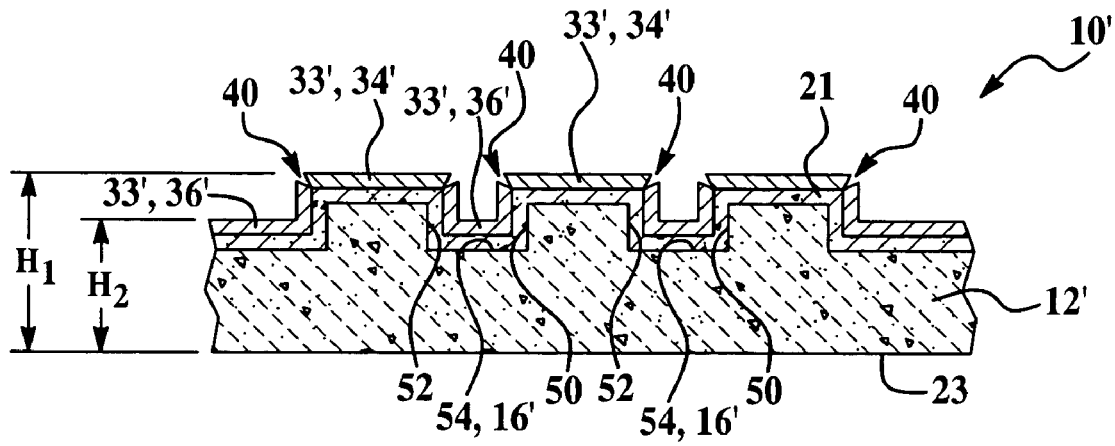

A sequence of steps of another embodiment of the method of forming a thin film device 10' (FIG. 6C) is shown in FIGS. 6A through 6C. In this embodiment, the nano-gaps 40 are formed from depositing or otherwise establishing a layer 33', which layer is at least a semi-conductive layer, on a stress layer 21 and using the asymmetric stress property of the stress layer 21 to generate weaknesses in the layer 33' to form cracks (i.e., nano-gaps 40) therein.

With reference now to FIG. 6A, a thin film device 10' (shown in FIG. 6C) is made by providing a substrate 12' (such as those substrate materials previously described herein). The substrate 12' may be pre-formed (e.g., patterned and etched) to include a plurality of contours formed in a first surface 16' of the substrate 12'. The contours may be configured to resemble a plurality of parallel trenches 19, where each trench 19 is defined by first and second side surfaces 50, 52 and a bottom surface 54 that is formed of the first substrate surface 16'. Generally, the patterned substrate 12' has a top surface 16' that has two different heights, for example, at a top of the trench 19 and at the bottom of the trench 19, relative to a bottom substrate surface 23.

Referring now to FIG. 6B, a thin stress layer 21 is established on the substrate 12' using a vapor deposition process, such as plasma enhanced chemical vapor deposition (PECVD). As depicted, the stress layer 21 conforms to the contours of the substrate 12'.

The stress layer 21 is a material that is subjected to high levels of tensile strain ranging from about 0.1% to about 10%, for example, during a thermal treatment. As defined herein, "tensile strain" refers to the strength of a material that tends to increase in the tensile direction. Tensile strain may generally be increased until the material reaches tensile strength, the point just before the material tears or ruptures. The tensile strain of the stress layer 21 may be controlled based on the material(s) selected and the conditions in which the stress layer 21 is established on the substrate 12'. Suitable materials for the stress layer 21 include materials such as silicon, silicon dioxide, or a suitable polymer. In a non-limiting example, the stress layer 21 may be any material (including conductive, semi-conductive, or insulating materials) so long as the material is prone to cracking. In an embodiment, the thickness of the stress layer 21 ranges from about 50 nm to about 5 μm.

The layer 33' is established as a layer on the stress layer 21 using a sputter deposition or an e-beam evaporation deposition technique. The layer 33' is deposited to conform to the contours of the substrate 12' and the deposited stress layer 21, thereby defining positive edges 58 of the layer 33'. Suitable materials for layer 33' may be the same as materials suitable for material 33. In an embodiment, the thickness of the layer 33' ranges from about 50 nm to about 300 nm.

With reference now to FIG. 6C, the thin film device 10' formed after thermal or physical treatment of the layers 21, 33' is depicted. Thermal treatment releases the stress of the stress layer 21, thereby causing the layer 33' to crack or otherwise weaken at the positive edges 58 (as shown in FIG. 6B). Physical treatment stretches the layer 33', causing cracks to form at the positive edges 58. The "cracks" form nano-gaps 40 which isolate portions of the layer 33', thereby defining uneven first and second at least semi-conductive strips 34', 36', respectively. In an embodiment, the size of the nano-gap 40 ranges from about 100 nm to about 1 μm.

As depicted in FIG. 6C, the uneven strips 34', 36' in this embodiment are located at different heights $H_1$, $H_2$ relative to the bottom surface 23 of the substrate 12'.

In an embodiment, thermal treatment may be accomplished by an annealing process. During establishment of the layer 33' on the stress layer 21, a stress may be built up within the stress layer 21 by controlling deposition power and pressure. During a thermal annealing process, the stress increases due, at least in part, to a different thermal expansion between layer 21 and the substrate 12'. The stress may be released by cracking. As a non-limiting example, the annealing temperature is below about 500° C. In an alternate non-limiting example, the annealing temperature is below about 250° C.

Any tension or stress in the substrate 12' may be controlled both during and after establishing the layers 21 and 33'. The stretchability of the flexible substrate 12' may be advantageously used to generate cracks in the layer 33' to form the strips 34', 36' by simply stretching the stack 10' (e.g., physical treatment). Depending on the direction and manner that the stack 10' is stretched, cracks or gaps 40 may be formed in desired locations and under the desired conditions.

Figure 7A:
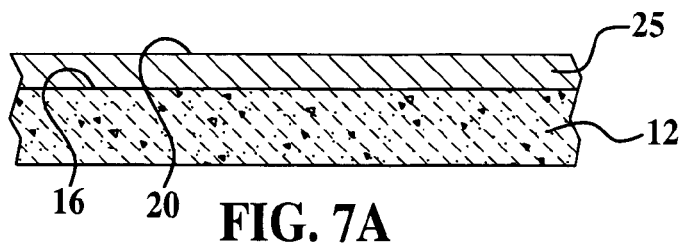
FIGS. 7A through 7E depict cross-sectional cutaway views of a sequence of steps according to yet another embodiment of a method of forming a thin film device.
Figure 7B:
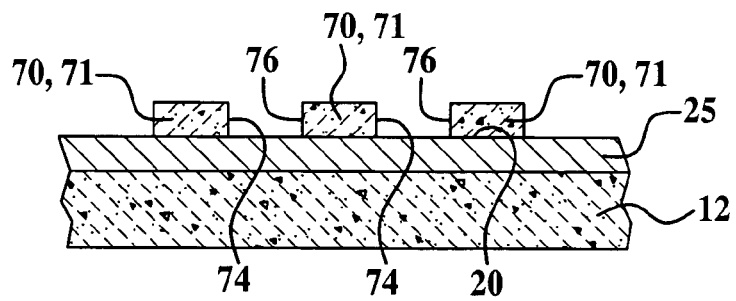
Figure 7C:
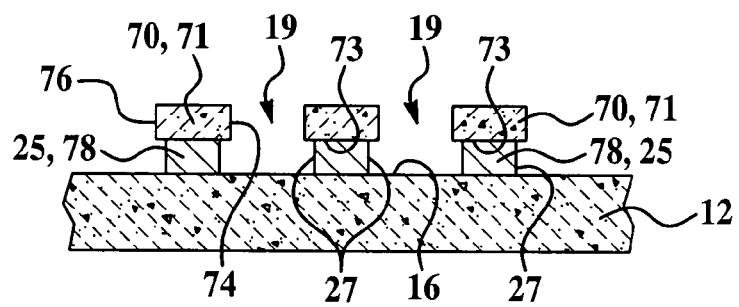
Figure 7D:
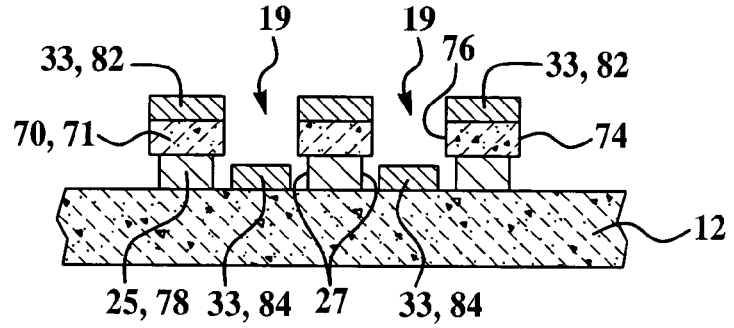
Figure 7E:
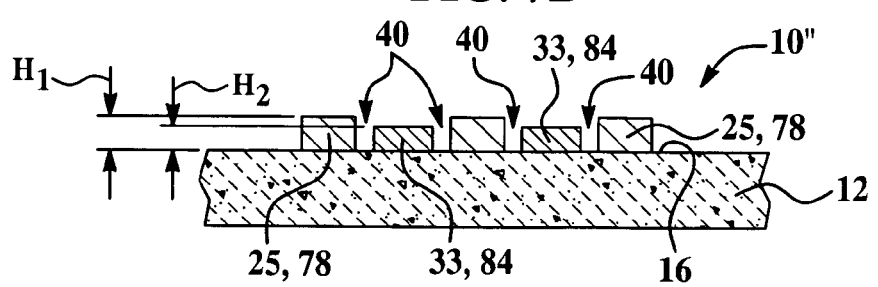

A sequence of steps of yet another embodiment of the method of forming a thin film device 10" (as shown in FIG. 7E) is shown in FIGS. 7A through 7E. The nano-gaps 40 (as shown in FIG. 7E) are formed between adjacent uneven strips 78, 84, which strips are formed from an at least semi-conductive material, established on the substrate 12. In this embodiment, the uneven strips 78, 84 are formed from establishing first material 25 on the substrate 12 and removing portions of the first material 25 to form the trench 19. Second material 33 is established on the exposed portions of the substrate 12. A nano-gap 40 is formed between strips 78, 84 of first and second materials 25, 33.

With reference to FIG. 7A, a substrate 12 has established thereon a first layer of material 25 thereon using, for example, sputtering, e-beam evaporation processes, or other suitable deposition processes previously described. The first material 25 is a conductive and/or a semi-conductive material. As a non-limiting example, the first material 25 in this embodiment has a thickness ranging from about 50 nm to about 300 nm.

Referring now to FIG. 7B, a polymer resist 70 is deposited on the first material 25. The polymer resist 70 defines a pattern to be formed on the first material 25. The pattern may be formed by any suitable patterning technique such as, for example, imprint lithography, photolithography, inkjet printing, or screen printing. As shown in FIG. 7B, the resist 70 is configured as substantially parallel resist strips 71 that are spaced a distance that is suitable for subsequently forming trenches 19. In an embodiment, the space is defined by first and second side surfaces 74, 76 of the resist strip 71 and a first surface 20 of the first material 25.

As shown in FIG. 7C, etching may be performed in the spaces defined between the resist strips 71. Etching results in the removal of the first material 25 adjacent the spaces to form trenches 19 and expose portions of the substrate surface 16. The portions of material 25 may be removed (e.g., by isotropic etching) in a generally downward or vertical direction. In an embodiment, removal may generally begin at a location underlying a first surface 73 and adjacent to side surfaces 74, 76 of the resist strips 71 such that the beginning of an edge 27 under-cuts the resist strip 71. The distance from the side surface 74, 76 to the beginning of a respective edge 27 ranges from about 50 nm to about 500 nm. In an embodiment, the first material 25 is removed so that the edge 27 is substantially perpendicular to the surfaces 16, 73. The edge 27 of the trench 19 generally ends at the surface 16 of the substrate 12. The remaining portions of the first material 25 form parallel strips 78.

FIG. 7D depicts the selective establishment of a discontinuous second material 33. The second material 33 is established so that a gap 40 (shown in FIG. 7E) between the strips 78 of the first material 25 and the second material 33 is formed without additional removal processes. As a non-limiting example, the size of the nano-gap 40 ranges from about 50 nm to about 500 nm.

Portions of the material 33 are established on the resist strips 71, thereby forming strips 82, and portions of the material 33 are established on the exposed substrate 12, thereby forming strips 84. The strips 82, 84 are generally formed in an alternating and substantially parallel configuration. Suitable materials for the second material 33 may be the same materials as those selected for the first material 25. The thickness of the second material 33 ranges from about 50 nm to about 300 nm, but is different than the thickness of the first material 25. The thickness and width of each material 25, 33 is selected so that the formed strips 78, 84 are uneven and electrically isolated.

As shown in FIG. 7E, when the resist strips 71 are dissolved in a solvent, the strips 82 are lifted off as well. The removal of these strips 71, 82 results in the formation of the thin film device 10". The strips 78 of the first layer 25 and the strips 84 of the second layer 33 remain on the substrate 12, where a nano-gap 40 is formed between the adjacent strips 78, 84. In this embodiment, the first and second at least semi-conductive strips 78, 84 are located at different heights $H_1$, $H_2$ with respect to the substrate surface 16. The embodiment depicted in FIG. 7E is a non-limiting example in which both of the strips 78, 84 are established on the substrate surface 16, but are located at different heights $H_1$, $H_2$.

In any of the embodiments disclosed herein, the formation of another thin film device (e.g., the thin film transistor shown in FIG. 8) may be completed using embodiments of the the thin film device 10, 10', 10". Generally, a dielectric layer may be established to fill the gap(s) 40 and substantially cover the strips 34, 34', 36, 36', 78, 84; another (i.e., third) material may be established on the dielectric layer; and a top (e.g., metal) layer may be established on the other material.

Figure 8:
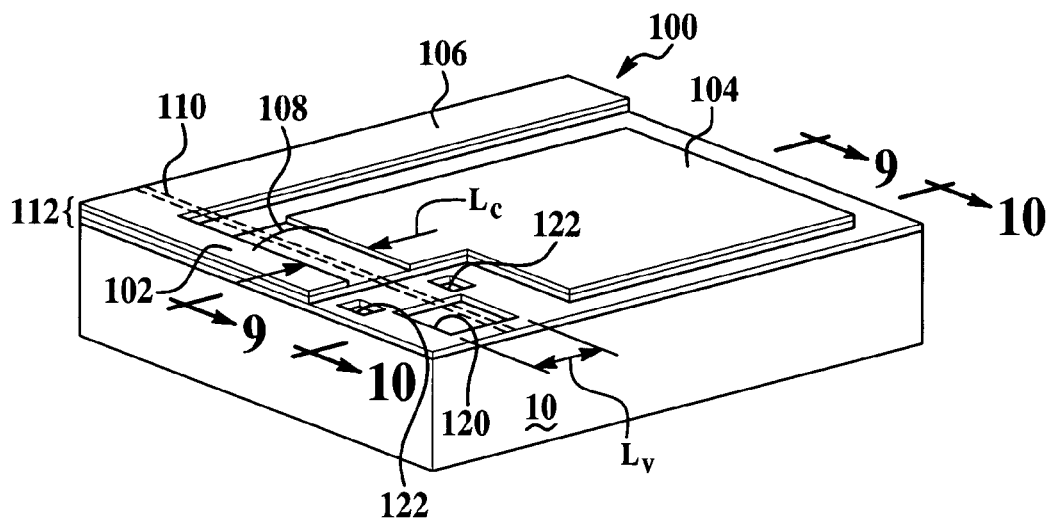
FIG. 8 is a perspective view of a thin film transistor fabricated according to method(s) of the present disclosure.
Figure 9:
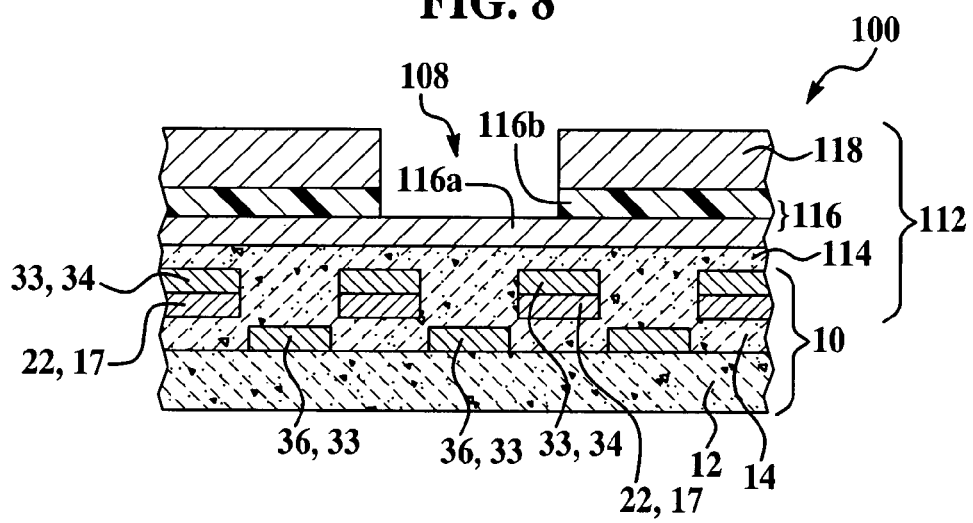
FIG. 9 is a cross-sectional view of the thin film transistor taken along line 9-9 of FIG. 8.
Figure 10:
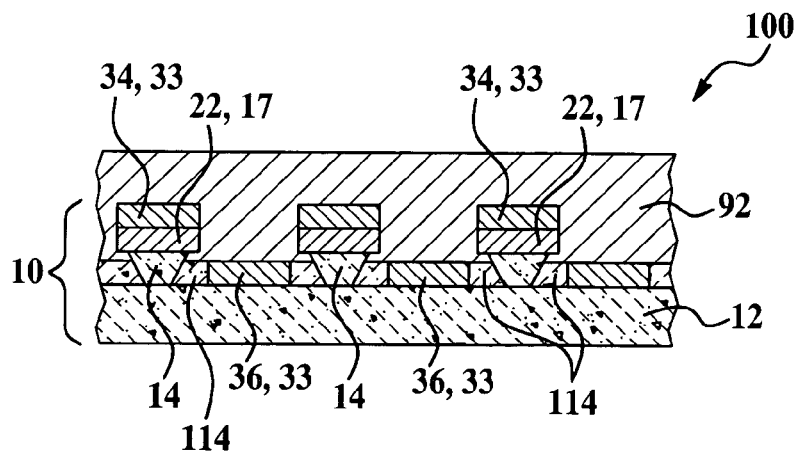
FIG. 10 is a cross-sectional view of the thin film transistor taken along line 10-10 of FIG. 8.

A thin film transistor, such as a bottom-gate TFT, may be built on the completed thin film device 10, 10', 10". The following description pertaining to FIGS. 8-10 illustrates the formation of a thin film transistor 100 using the device 10 shown in FIG. 2D. It is to be understood, however, that any of the embodiments of the device 10, 10', 10" disclosed herein may be used to form a thin film transistor. It should also be appreciated that the dielectric layer, the third material layer, and the top layer may be established on the thin film device 10, 10', 10" using roll-to-roll fabrication techniques. It should also be appreciated that both the thin film device 10, 10', 10" and the other layers (i.e., dielectric, third material, and top layer) may be individually fabricated (i.e., fabrication of the several layers of each stack) using roll-to-roll fabrication techniques.

FIG. 8 is a perspective view of a bottom-gate TFT 100 including a source electrode 102, a drain electrode 104, a data line 106 joined to the source electrode 102, a channel 108, a gate electrode 110 (shown as a dotted line) disposed below the channel 108, and a via 120 having edges that are substantially aligned with the edges of the channel 108. As such, a length $L_V$ of the via 120 is substantially equivalent to the length $L_C$ of the channel 108. It is to be understood that the via 120 enables the connection of strips 22, 34, 36 under the channel 108. Generally, the via 120 is also established a spaced distance from the channel 108. Cut-off vias 122 may be aligned with the channel edges so that the openings of the cut-off vias 112 are outside the channel length $L_C$, and thus interrupt the conductive strips 22, 34, 36 on either side of channel 120.

The source electrode 102, drain electrode 104, channel 108 and gate electrode 110 are formed in a multi-layered stack 112, which is deposited or otherwise established on the thin film device 10.

With reference now to FIG. 9, the stack 112 includes at least the dielectric layer 114, the at least semi-conductive (third) layer 116, and the top metallic layer 118. In some instances, a contact layer (such as a doped semi-conductor layer) may also be deposited between the at least semiconductive layer 116 and the top metallic layer 118. In an embodiment, deposition of each layer 114, 116 and 118 is relatively uniform. The dielectric layer 114 is generally made of an insulating material such as silicon nitride, and is established over the thin film device 10. In embodiments where the substrate 12 of the device 10 is transparent, the dielectric material 114 may be a silicon oxide or aluminum oxide. As shown in a cross-section of the thin film transistor 100 in FIG. 9, the material for the dielectric layer 114 blends with the insulating layer 14 to form one continuous layer of insulating material surrounding any of the strips 22, 34, 36 formed in the device 10, and fills the nano-gaps 40. As a result, the insulating layer 14 or dielectric material 114 separates and isolates each adjacent strip 22, 34, 36.

The at least semi-conductive layer 116 of the stack 112 is generally made of a suitable semi-conductive or conductive material, non-limiting examples of which include amorphous silicon or $N^+$ doped microcrystalline or amorphous silicon. As shown in FIG. 9, the layer 116 may have two separate semi-conductive sections 116a, 116b. In an embodiment, the semi-conductive section 116a may be an amorphous silicon or a microcrystalline silicon, and the semi-conductive section 116b may be heavily doped n-type or $N^+$ amorphous silicon. In embodiments where the substrate 12 of the stack 10 is transparent, transparent semi-conductive organic or doped materials may also be used.

The top layer 118 of the stack 112 is generally made of a metal and is established over the layer 116. Non-limiting examples of suitable metals include chromium, aluminum, copper, titanium, alloys thereof, or combinations thereof. For embodiments where the substrate 12 of the device 10 is transparent, transparent conductive materials such as zinc oxide or tin oxide may be used.

As a non-limiting example, the formation of the channel 108 will be described. As shown in FIG. 9, a portion of the top metal layer 118 of the stack 112 is removed by etching to establish the channel 108 therein. In some instances, exposed portions of the other layers, such as the at least semi-conductive layer 116, are removed as well. With an etching process (e.g., reactive ion etching), typically the layer 116 is etched or otherwise removed before the exposed top metal layer 118 is etched, the exposed portion of the top metal layer 118 serving to protect and define the portion of the layer 116 that will define the channel 108.

With reference now to FIG. 10, selective bundling of the strips 34, 36 by a metal layer 92 at via 120 (shown in FIG. 8) is depicted. Using a self-aligned imprint lithography (SAIL) process, the via 120 is established by etching (with an imprint SAIL mask) the stack 112 to remove portions of layers 114, 116, 118. The details of the SAIL process are described in U.S. Patent Publication Number 2004/0002216, which is incorporated herein by reference in its entirety. This process exposes at least a portion of the strips 34, 36 at the via 120. These portions of the strips 34, 36 are connected by the metal layer 92. Suitable metals for metal layer 92 include chromium, aluminum, copper, or jetted conductive ink (e.g., silver ink), or the like.

Embodiment(s) of devices 10, 10', 10" and methods disclosed herein include, but are not limited to the following advantages. Each of the devices 10, 10', 10" include uneven (i.e., located at different heights relative to a substrate surface), at least semi-conductive strips 22, 34, 34', 36, 36', 78, 84. The location of the uneven strips 22, 34, 34', 36, 36', 78, 84 and the nano-gaps therebetween 40 advantageously ensures electrical isolation when desirable. Furthermore, the methods for forming the thin film devices 10, 10', 10" and the other thin film devices (e.g., transistors 100, 100") disclosed herein may be accomplished in a roll-to-roll fabrication environment, without the use of nano-imprinting for formation of the gaps.

While several embodiments have been described in detail, it will be apparent to those skilled in the art that the disclosed embodiments may be modified. Therefore, the foregoing description is to be considered exemplary rather than limiting.

What is claimed is:

1. A method for forming a thin film device, comprising:
   forming a first at least semi-conductive strip located at a first height relative to a surface of a substrate;
   forming a second at least semi-conductive strip adjacent to the first at least semi-conductive strip, the second strip located at a second height relative to the substrate surface, the second height being different than the first height; and
   forming a nano-gap between the first and second at least semi-conductive strips;
   wherein forming the first strip, the second strip, and the nano-gap is accomplished by:
      establishing an insulating layer on the substrate;
      establishing a mask layer on the insulating layer;
      removing at least a portion of the mask layer to form at least one trench;
      removing a portion of the insulating layer adjacent the at least one trench, thereby exposing a portion of the substrate; and
      establishing an at least semi-conductive material on the remaining mask layer to form the first strip, and on at least a portion of the exposed substrate to form the second strip.

2. The method as defined in claim 1, further comprising:
   establishing a dielectric material on the first and second at least semi-conductive strips, thereby filling the nano-gap and electrically isolating the first at least semi-conductive strip from the second at least semi-conducting strip;
   establishing an at least semi-conductive material on the dielectric material; and
   establishing a top layer on the at least semi-conductive material.

3. The method as defined in claim 1, further comprising exposing at least one tapered edge under-cutting a portion of the mask layer adjacent the at least one trench and extending outwardly from the mask layer to the substrate as the portion of the insulating layer is removed.

4. The method as defined in claim 1, further comprising exposing at least one tapered edge under-cutting a portion of the mask layer adjacent the at least one trench and extending inwardly from the mask layer adjacent to the substrate as the portion of the insulating layer is removed.

5. The method as defined in claim 1, further comprising exposing at least one edge under-cutting a portion of the mask layer adjacent the at least one trench and extending vertically from the mask layer to the substrate as the portion of the insulating layer is removed.

6. The method as defined in claim 1, wherein a thickness of the at least semi-conductive material is substantially smaller than a thickness of the insulating layer.

7. A method for forming a thin film device, comprising:
   forming a first at least semi-conductive strip located at a first height relative to a surface of a substrate;
   forming a second at least semi-conductive strip adjacent to the first at least semi-conductive strip, the second strip located at a second height relative to the substrate surface, the second height being different than the first height; and forming a nano-gap between the first and second at least semi-conductive strips;

wherein forming the first strip, the second strip, and the nano-gap is accomplished by:

patterning the substrate so that a top substrate surface has two different heights relative to a bottom substrate surface;

establishing a stress layer on the top surface of the patterned substrate;

establishing an at least semi-conductive material on the stress layer; and treating the stress layer to weaken at least a portion of the at least semi-conductive material, thereby forming the nano-gap and defining the first and second at least semi-conductive strips.

8. The method as defined in claim 7 wherein the stress layer is selected from a material subjected to a tensile strain ranging from about 0.1% to about 10% during the treating step.

9. The method as defined in claim 8 wherein treating is accomplished by applying a thermal treatment, a physical treatment, or combinations thereof.

10. A method for forming a thin film device, comprising:
forming a first at least semi-conductive strip located at a first height relative to a surface of a substrate;

forming a second at least semi-conductive strip adjacent to the first at least semi-conductive strip, the second strip located at a second height relative to the substrate surface, the second height being different than the first height; and forming a nano-gap between the first and second at least semi-conductive strips;

wherein forming the first strip, the second strip, and the nano-gap is accomplished by:

establishing a first at least semi-conductive material on the substrate; establishing a polymer resist on the first at least semi-conductive material;

removing at least a portion of the polymer resist to form at least one trench;

removing at least a portion of the first at least semi-conductive material adjacent the at least one trench, thereby forming the first at least semi-conductive strip and exposing a portion of the substrate; and selectively establishing a second at least semi-conductive material on a portion of the exposed substrate to form the second at least semi-conductive strip and the nano-gap.

11. The method as defined in claim 10, further comprising exposing at least one edge under-cutting the first at least semi-conductive material and extending downwardly from the first at least semi-conductive material to the substrate as the portion of the first at least semi-conductive material is removed.

12. The method as defined in claim 1 wherein each of the forming steps is accomplished via roll-to-roll fabrication.

13. The method as defined in claim 7 wherein each of the forming steps is accomplished via roll-to-roll fabrication.

14. The method as defined in claim 10 wherein each of the forming steps is accomplished via roll-to-roll fabrication.

* * * * *